US006335669B1

United States Patent
Miyazaki et al.

(10) Patent No.: US 6,335,669 B1
(45) Date of Patent: Jan. 1, 2002

(54) RF CIRCUIT MODULE

(75) Inventors: Moriyasu Miyazaki; Hidenori Yukawa; Hideyuki Oh-Hashi; Masatoshi Nii, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/361,213

(22) Filed: Jul. 27, 1999

(30) Foreign Application Priority Data

Dec. 9, 1998 (JP) ............................................ 10-350265

(51) Int. Cl.$^7$ ............................................. H03H 11/00
(52) U.S. Cl. ....................... 333/247; 361/761; 361/820; 257/723; 257/728; 174/52.4; 174/52.3
(58) Field of Search ................................. 361/761, 764, 361/820; 174/52.1, 52.3, 52.4, 58; 333/246, 247; 257/686, 723, 728

(56) References Cited

U.S. PATENT DOCUMENTS

| 5,266,912 A | * | 11/1993 | Kledzik ........................ 333/247 |
| 5,376,825 A | * | 12/1994 | Tukamoto et al. ........... 257/685 |
| 5,633,530 A | * | 5/1997 | Hsu ............................. 257/685 |
| 6,137,163 A | * | 10/2000 | Kim et al. .................... 257/686 |

FOREIGN PATENT DOCUMENTS

JP          8148800          6/1996

* cited by examiner

Primary Examiner—Robert Pascal
Assistant Examiner—Stephen E. Jones
(74) Attorney, Agent, or Firm—Rothwell, Figg, Ernst & Manbeck

(57) ABSTRACT

An RF circuit module comprising a first RF semiconductor device 19 mounted within a cavity 4 surrounded by a wall 3 of a first dielectric circuit board 1, and a second RF semiconductor device 29 mounted to a second dielectric circuit board 2 placed on the wall 3. A metal base 11 is disposed on the first circuit board 1 and a number of embedded conductors 13 such as via holes are embedded within the wall 3 and arranged to surround the cavity 4 so that each having one end electrically connected to the metal base 11 and the other end exposed and arranged to surround the cavity 4. A metal cover 12 is sealingly attached to the first circuit board 1 to cover the second circuit board 2 and the second RF semiconductor device 29 and electrically connected at the upper surface of the wall 3. Therefore, the first and second RF semiconductor devices are electrically shielded and hermetically sealed, providing an RF circuit module of small-sized and high-performance. The metal cover may have a plate-like shape, the first circuit board may be a high-temperature burned circuit board and the second circuit board may be a low-temperature burned circuit board, the electrical connection between the first circuit board and the second circuit board may be made through a solder bump or an anisotropic conductive sheet. The metal base 11 may be exposed to the cavity, the first circuit board may have mounted thereon a transmission circuit and the second circuit board may have mounted thereon a reception circuit, and a high-frequency circuit device, which is not necessary to be hermetically sealed, may be mounted on the first circuit board outside of the metal cover.

11 Claims, 6 Drawing Sheets

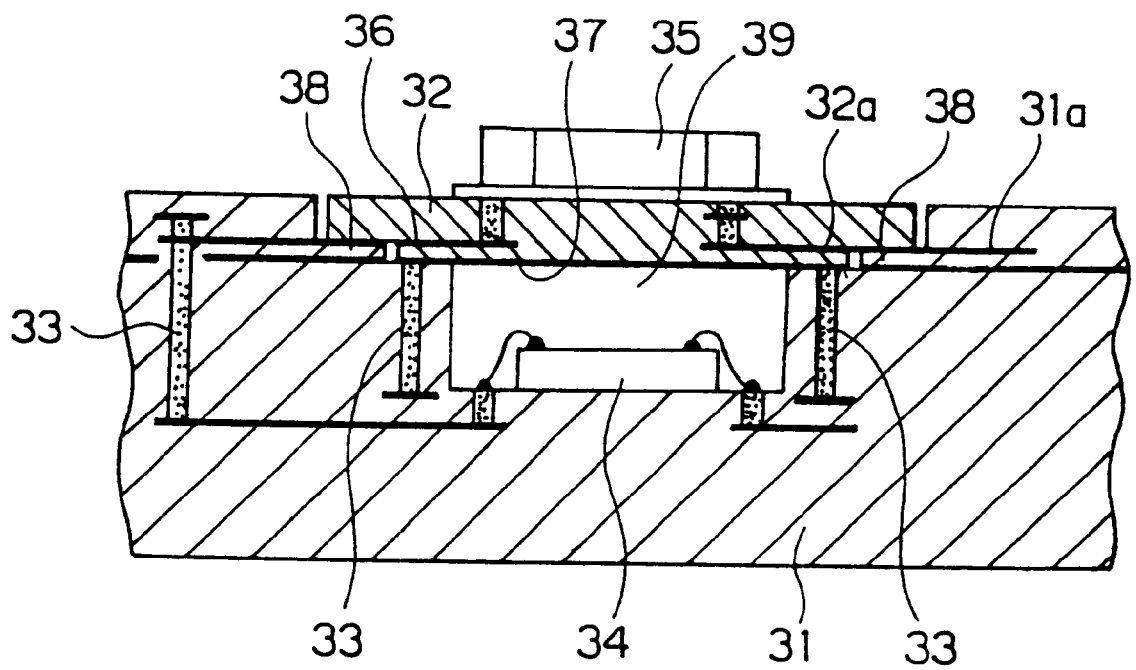

RF CIRCUIT MODULE

BACKGROUND OF THE INVENTION

This invention relates to an RF (radio frequency) circuit module and, more particularly, to an RF circuit module for use mainly in VHF band, UHF band, microwave band and mm-wave band.

FIG. 11 illustrates an example of a conventional RF circuit module disclosed in Japanese Patent Laid-Open No. 8-148800. In FIG. 11, the reference numeral 31 is a multi-layered first dielectric circuit board, 32 is a multi-layered second dielectric circuit board, 33 are via holes which are connecting members, 34 is a high frequency circuit element which is a first RF semiconductor device, 35 is a surface mounting component which is a second RF semiconductor device, 36 is a DC line, 37 is a ground pattern which is a ground conductor, 38 is a connection portion disposed on the first dielectric circuit board 31 in order to establish the connection between a DC line 31a of the first dielectric circuit board 31 and a DC line 32a of the second dielectric circuit board 32, and 39 is a cavity. The high frequency circuit element 34 is mounted within the cavity 39, and the second dielectric circuit board 32 is mounted on the top surface around the cavity 39, and the ground pattern 37 on the rear surface of the second dielectric circuit board 32 and the via holes 33 around the cavity 39. Also, the surface mounting component 35 is mounted on the second dielectric circuit board 32. The DC line 31a of the first dielectric circuit board 31 and the DC line 32a of the second dielectric circuit board 32 are connected to each other by overlapping of the respective DC lines 31a and 32a.

In the illustrated RF circuit module structure, the ground pattern 37 on the bottom surface of the second dielectric circuit board 32 is connected to the via holes 33 around the cavity 39, so that the cavity 39 is electrically shielded and hermetically sealed. Also, the surface mounting component 35 can be mounted onto the second dielectric circuit board 32, allowing the circuit to have a high mounting density.

However, since the conventional RF circuit module has the above-described structure, while the high frequency circuit element 34 mounted within the cavity 39 can be hermetically sealed, the circuit on the second dielectric circuit board 32 cannot be hermetically sealed. For this reason, there is a drawback which is that the surface mounting component 35 mounted on the second dielectric circuit board 32 must be separately sealed.

Also, since the provision of the connecting portion 38 is necessary to connect together the DC line 31a of the first dielectric circuit board 31 and the DC line 32a of the second dielectric circuit board 32, there is a drawback which is that both the resulting circuit size and the manufacturing cost are increased.

SUMMARY OF THE INVENTION

Accordingly, the present invention is aimed at solving the above described drawbacks of the conventional design. An object of the present invention is to provide an RF circuit module in which the high frequency circuit elements which are RF semiconductor devices mounted on the first dielectric circuit board and the second dielectric circuit board can easily be electrically shielded and hermetically sealed. Another object of the present invention is to reduce the size and improve the performance of the RF circuit module.

With the above object in view, the RF circuit module of the present invention comprises a multi-layered first dielectric circuit board in which a cavity surrounded by a wall is formed in an upper layer, a first RF semiconductor device mounted within the cavity on the first dielectric circuit board, a second dielectric circuit board of at least one layer connected at an upper surface of the wall to the first dielectric circuit board and having a ground conductor disposed on its bottom surface, a second RF semiconductor device mounted to the upper surface of the second dielectric circuit board. A metal cover is provided to cover the second dielectric circuit board and the second RF semiconductor device. The metal cover is connected at the upper surface of the wall to the first dielectric circuit board, thus providing an electric shield for the second RF semiconductor device and a hermetic seal for the first and second RF semiconductor device.

The first dielectric circuit board may comprise a dielectric member surrounding the second dielectric circuit board and the metal cover may have a plate-like shape.

According to the present invention, the RF circuit module comprises a first dielectric circuit board having defined in a first surface a cavity surrounded by a wall, a first RF semiconductor device mounted within the cavity of the first dielectric circuit board, a second dielectric circuit board placed on the wall of the first dielectric circuit board, and a second RF semiconductor device mounted to the second dielectric circuit board. A metal base is disposed on a second surface of the first dielectric circuit board and a number of embedded conductors are embedded within the wall and arranged to surround the cavity so that each has one end electrically connected to the metal base and the other end exposed from the first surface and arranged to surround the cavity. A metal cover is sealingly attached to the first dielectric circuit board to cover the second dielectric circuit board and the second RF semiconductor device. The metal cover is electrically connected at the upper surface of the wall, whereby the first and second RF semiconductor devices are electrically shielded and hermetically sealed.

The wall may comprise an extension portion having defined therein a second cavity for surrounding the second dielectric circuit board and the second RF semiconductor device, and the metal cover may have a plate-like shape.

The first dielectric circuit board may be a high-temperature burned circuit board while the second dielectric circuit board may be a low-temperature burned circuit board.

The first dielectric circuit board and the second dielectric circuit board may be electrically connected to each other either through a solder bump or an anisotropic conductive sheet.

The RF circuit module may further comprise a high-frequency circuit device, which is not necessary to be hermetically sealed, mounted on the first dielectric circuit board outside of the metal cover.

The first dielectric circuit board may includes a stepped portion for mounting the high-frequency circuit device thereon.

The metal base on the first dielectric circuit board may be exposed to the bottom of the cavity.

The first dielectric circuit board may have mounted thereon a transmission circuit and the second dielectric circuit board may have mounted thereon a reception circuit.

BRIEF DESCRIPTION OF THE DRAWINGS

The present invention will become more readily apparent from the following detailed description of the preferred embodiments of the present invention taken in conjunction with the accompanying drawings, in which:

FIG. 11 is a sectional view showing a conventional RF circuit module.

DETAILED DESCRIPTION OF THE PREFERRED EMBODIMENTS

Embodiment 1

Figure 1:
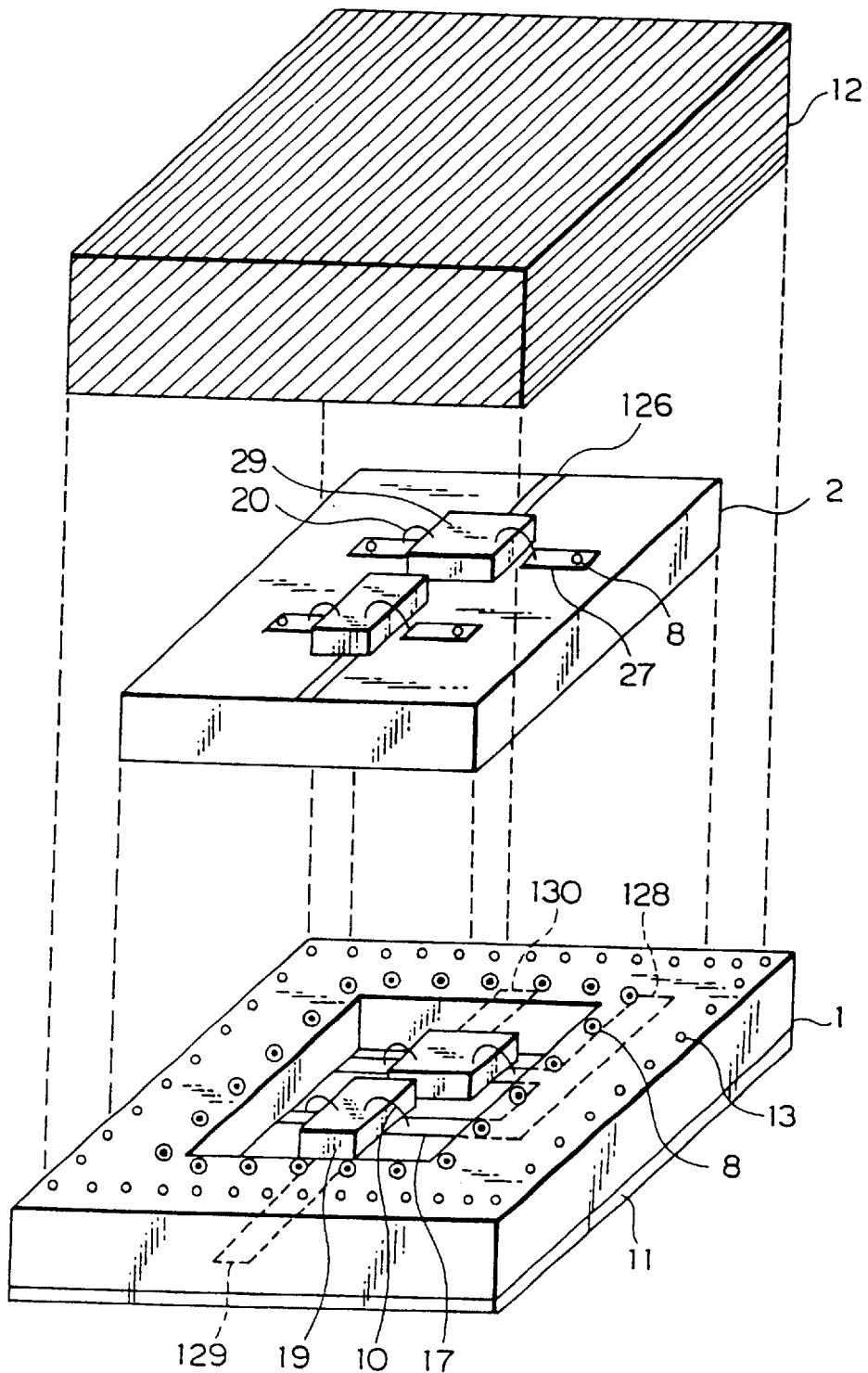
FIG. 1 is an exploded view illustrating the structure of an RF circuit module of the first embodiment of the present invention.
Figure 2:
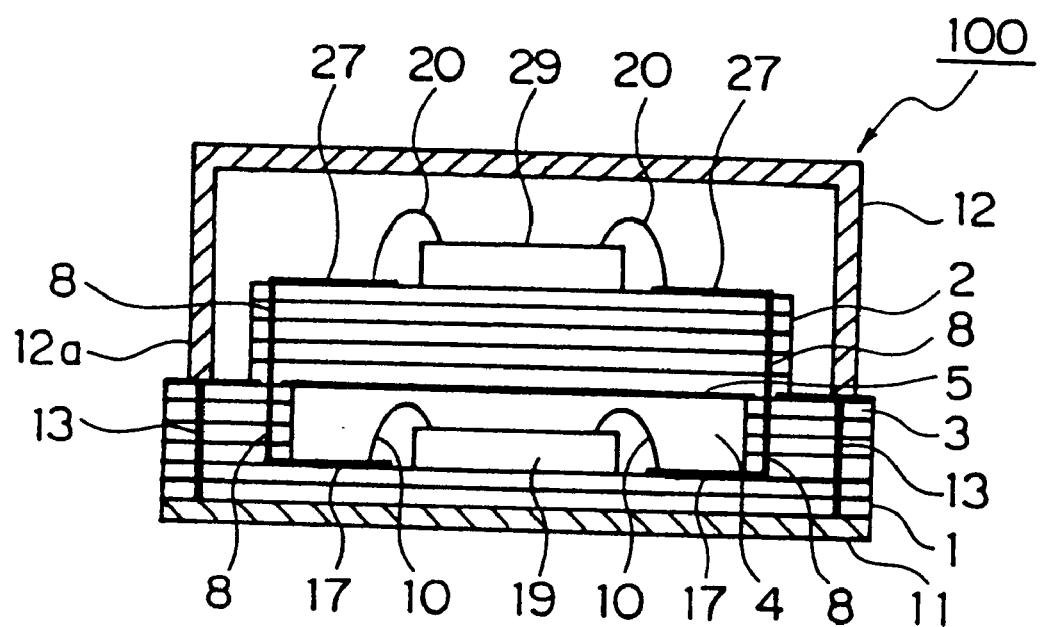
FIG. 2 is a sectional view showing the RF circuit module of the first embodiment of the present invention.

FIG. 1 is an exploded view illustrating the structure of an RF circuit module 100 of an embodiment of the present invention, and FIG. 2 is a sectional view showing the RF circuit module 100 of the present invention.

In FIGS. 1 and 2, a first dielectric circuit board 1 has an upper or a first surface and a lower or a second surface. The second surface has a flat plate-like metal base 11 disposed thereon. The first dielectric circuit board 1 is partially removed from the middle layer to the upper layer except for the portion placed on the metal base 11 in order to make a recess or a cavity 4 therein. This means that the cavity 4 is defined by a wall 3 of the first dielectric circuit board 1. In this wall 3, a number of via holes 13 are provided over the entire circumference of the cavity 4. Each hole 13 extends from the metal base 11 to the upper surface of the wall 3.

Within the cavity 4, an RF semiconductor device 19 is mounted on the first dielectric circuit board 1. The RF semiconductor device 19 is electrically connected through wires 10 to DC lines 17 disposed on the first dielectric circuit board 1. The upper surface of the wall 3 has a multi-layered second dielectric circuit board 2 placed thereon. The circuit board 2 has aground conductor 5 at its lower or bottom surface, therefore, the upper surface of the wall 3 is connected with the circuit board 2. A DC lines 27 are disposed on the second dielectric circuit board 2 and electrically connected to the DC lines 17 of the first dielectric circuit board 1 through via holes 8. The second dielectric circuit board 2 has also mounted thereon a second RF semiconductor device 29. The DC lines 27 disposed on the second dielectric circuit board 2 are electrically connected to the second RF semiconductor device 29 through wires 20.

A parallelepiped box-shaped metal cover 12 made of a metal sheet having an opening at its bottom is disposed on the first dielectric circuit board 1 to cover the second dielectric circuit board 2. The metal cover 12 is secured at its end portion 12a by an electrically conducting bonding agent or the like to the top surface of the wall 3 of the first dielectric circuit board 1. The metal cover 12 is electrically connected to the via holes 13 disposed in the wall 3 of the first dielectric circuit board 1 and connected to the metal base 11.

Therefore, the first and the second RF semiconductor devices 19 and 29 are electrically shielded by the electrically mutually connected metal base 11, the via holes 13 and the metal cover 12. Additionally the first and the second RF semiconductor devices 19 and 29 are sealed by the mutually and hermetically sealed first and the second dielectric circuit boards 1 and 2 and the metal cover 12.

The assembly of the RF module circuit 100 is achieved, as shown in FIG. 1, by connecting the metal cover 12 to the first dielectric circuit board 1 after the second dielectric circuit board 2 to which the second RF semiconductor device 29 is mounted is connected to and mounted on the first dielectric circuit board 1 to which the first RF semiconductor device 19 is mounted.

In the RF circuit module 100 of this embodiment, the first dielectric circuit board 1 having the first RF semiconductor device 19 mounted thereon and the second dielectric circuit board 2 having the second RF semiconductor device 29 mounted thereon are stacked. The metal cover 12 is sealingly attached to the upper surface of the wall 3 of the first dielectric circuit board 1 and electrically connected to the metal base 11 by means of the via holes 13 disposed around the cavity 4 of the second dielectric circuit board 2. As a result, the first RF semiconductor device 19 and the second RF semiconductor device 29 are electrically shielded and hermetically sealed with ease, thereby reducing the size and improve the performance of the RF circuit module.

Embodiment 2

Figure 3:
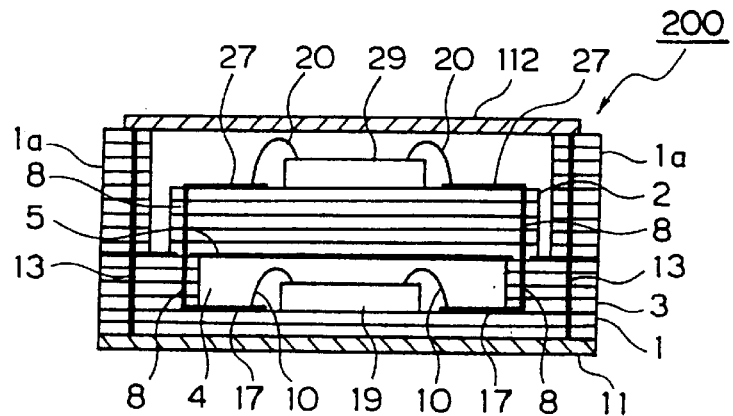
FIG. 3 is a sectional view showing the RF circuit module of the second embodiment of the present invention.

FIG. 3 is a sectional view illustrating an RF circuit module 200 of another embodiment of the present invention. Hereinafter, the components identical or similar to those shown in FIGS. 1 and 2 are assigned with the same reference numbers. Thus, explanation of their identical components will not be duplicated.

The RF circuit module 200 shown in FIG. 3 is different from the RF circuit module 100 shown in FIG. 1 in the construction of the enclosure around the second dielectric circuit board 2 and the second semiconductor device 29. A ceramic extension 1a is placed on top of the wall 3 of the first dielectric circuit board 1 thereby defining a second cavity surrounding and accommodating the second dielectric circuit board 2 and the second RF semiconductor device 29. The extension 1a contains a number of via holes electrically connected in correspondence with the via holes 13. A flat plate-like metal cover 112 is placed on top of the extension 1a. The metal cover is connected to the extension portion 1a by an electrically conductive bonding agent or the like so that the metal base 11 and the metal cover 112 are electrically connected to each other. The other structures in FIGS. 3 and 100 are the same.

Since the RF circuit module 200 of this embodiment has the above-described structure, it provides similar advantages as those of the RF circuit module shown in FIGS. 1 and 2. The metal cover 112 is a flat plate-like member, so that the easiness and efficiency of the assembly of the metal cover 112 can be improved.

Embodiment 3

Figure 4:
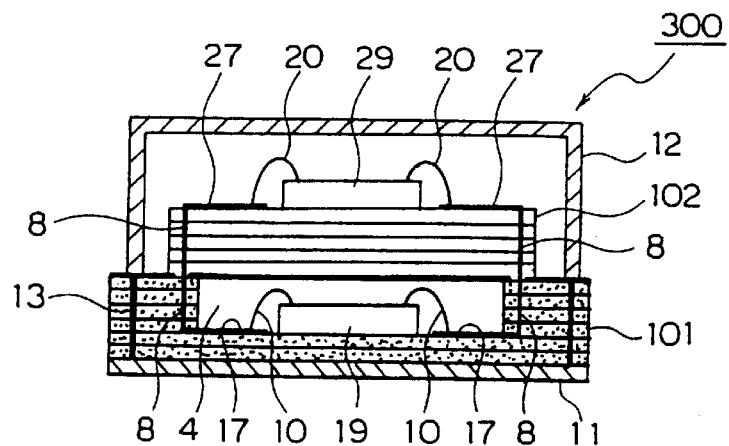
FIG. 4 is a sectional view showing the RF circuit module of the third embodiment of the present invention.

FIG. 4 is a sectional view illustrating an RF circuit module 300 of another embodiment of the present invention. The first dielectric circuit board 101 and the second dielectric circuit board 102 are made of materials different from those of FIG. 2. The first dielectric circuit board 101 is a laminated high-temperature burned circuit board made of a highly heat-conducting circuit board material such as aluminum nitride. The second dielectric circuit board 102 is a laminated low temperature burned circuit board. The low temperature burned circuit board is a circuit board that is burned at a temperature lower than an ordinary burning temperature, so that a material having a lower melting point such as gold and silver can be used as the wiring material for wiring the circuit board because of the low burning temperature.

Thus, the RF circuit module 300 of this embodiment provides, in addition to the advantages obtained in the RF circuit module shown in FIGS. 1 and 2, the advantages that heat dissipation can be efficiently achieved even when a device which generates a large amount of heat is used as the RF semiconductor device 19 to be mounted on the first dielectric circuit board 101 because of the good heat conductivity of the high-temperature burned circuit board. Also, the use of the low-temperature burned circuit board as the second dielectric circuit board 102 allows a wiring material such as gold and copper to be used in the DC lines 27 of the second dielectric circuit board 102, which decreases the electric resistance of the DC lines 27 because of the low resistivity of these wiring materials. Therefore, the voltage drop due to the DC lines 27 of the second dielectric circuit board 102 can be suppressed.

Embodiment 4

Figure 5:
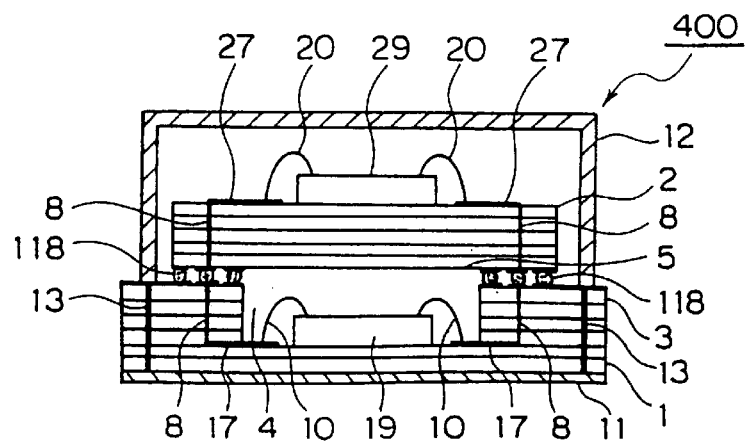
FIG. 5 is a sectional view showing the RF circuit module of the fourth embodiment of the present invention.

FIG. 5 is a sectional view showing the RF circuit module 400 of another embodiment of the present invention. The structure of this embodiment is different from that shown in FIG. 2 in that solder bumps 118 are inserted between the first dielectric circuit board 1 and the second dielectric circuit board 2. Ball-shaped solder bumps 118 are inserted between the upper surface of the wall 3 of the first dielectric circuit board 1 and the ground line 5 on the bottom surface of the second dielectric circuit board 2.

Thus, the RF circuit module 400 in this embodiment provides, in addition to the advantages similar to those of the RF circuit module shown in FIGS. 1 and 2, the advantage that the RF circuit module can be made small-sized as compared to the case where the connecting portions in which the DC lines 17 and 27 must overlap are used. The reason for this is that the connection between the DC lines 17 of the first dielectric circuit board 1 and the DC lines 27 of the second dielectric circuit board 2 as well as the connection between the first dielectric circuit board 1 and the ground conductors 5 of the second dielectric circuit board 2 are provided by means of the via holes 8 and the solder bumps 118.

Embodiment 5

Figure 6:
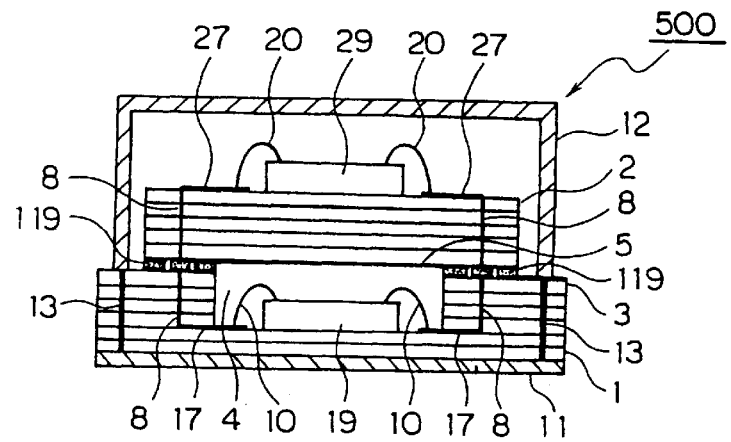
FIG. 6 is a sectional view showing the RF circuit module of the fifth embodiment of the present invention.

FIG. 6 is a sectional view showing the RF circuit module 500 of another embodiment of the present invention. The structure of this embodiment is different from that shown in FIG. 2 in that an anisotropic conductive sheet 119 is inserted between the first dielectric circuit board 1 and the second dielectric circuit board 2. The anisotropic conductive sheet has different property according to the orientation of the sheet material. It allows conducting particles to move easily and increases the electrical conductivity in the direction of opposition of the first dielectric circuit board 1 and the second dielectric circuit board 2.

Thus, the RF circuit module 500 in this embodiment provides, in addition to the advantages similar to those of the RF circuit module shown in FIG. 5, the advantage that the electrical connection between the first dielectric circuit board 1 and the second dielectric circuit board 2 can be achieved without the need of the solder reflow, improving the easiness of the assembly and the replacement of the second dielectric circuit board 2 because the connection between the DC lines 17 of the first dielectric circuit board 1 and the DC lines 27 of the second dielectric circuit board 2 as well as the connection between the first dielectric circuit board 1 and the ground conductors 5 of the second dielectric circuit board 2 can be established by means of the anisotropic conductive sheet 119.

Embodiment 6

Figure 7:
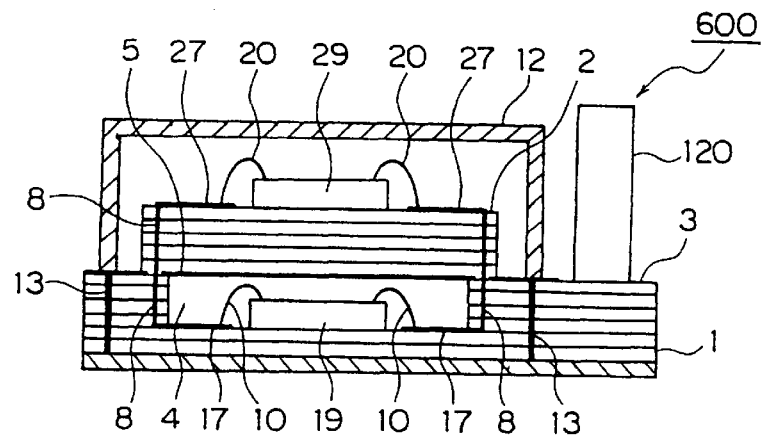
FIG. 7 is a sectional view showing the RF circuit module of the sixth embodiment of the present invention.

FIG. 7 is a sectional view showing the RF circuit module 600 of another embodiment of the present invention. The structure of this embodiment is different from that shown in FIG. 2 in that a high-frequency circuit device 120 such as a chip capacitor that is not necessary to be hermetically sealed is mounted on the first dielectric circuit board 1 outside of the metal cover 12.

Thus, the RF circuit module 600 of this embodiment provides, in addition to the advantages similar to those of the RF circuit module shown in FIG. 2, the advantage that the occupation area of the cavity 4 can be reduced, allowing easy suppression of the unnecessary wave guide mode. That is, the metal base 11, the via holes 13 and the ground conductors 5 provided around the cavity 4 defines a wave guide-like structure substantially surrounded by the metal walls at four directions. Therefore, if the cavity 4 has provided therein with the high-frequency circuit device 120 such as a capacitor that does not need to be hermetically sealed, the occupation area of the cavity 4 becomes large accordingly. Additionally, the width of the wave guide also becomes large. This results in a tendency that the generation of the unnecessary wave guide mode takes place in which a radio wave of a lower-frequency (shorter wavelength) is propagated. Therefore, by placing the high-frequency circuit device 120 that does not have to be hermetically sealed outside of the metal cover 12, the occupation area in the cavity 4 can be made small, facilitating the suppression of the occurrence of the unnecessary wave guide mode.

Embodiment 7

Figure 8:
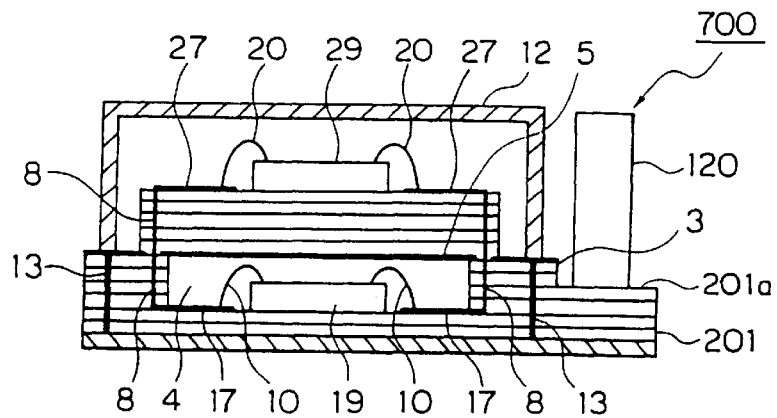
FIG. 8 is a sectional view showing the RF circuit module of the seventh embodiment of the present invention.

FIG. 8 is a sectional view showing an RF circuit module 700 of another embodiment of the present invention. In this figure, the configuration of the section to which the high-frequency circuit device 120 of the first dielectric circuit board 201 is mounted is different from that shown in FIG. 7.

The first dielectric circuit board 201 has a portion of the dielectric material from the middle layer to the upper layer partially removed to define a stepped portion 201a. On this stepped portion 201a having a smaller thickness of the first dielectric circuit board 201 height is provided, the high-frequency circuit device 120 that does not need to be hermetically sealed such as chip capacitor.

Thus, the RF circuit module 700 of this embodiment provides, in addition to the advantages similar to those of the RF circuit module shown in FIG. 7, the advantage that the high-frequency circuit device 120 such as a chip capacitor that does not have to be hermetically sealed can be mounted to the low-height portion of the first dielectric circuit board 201 outside of the metal cover 12, so that the overall height of the RF circuit module 700 can be reduced.

Embodiment 8

Figure 9:
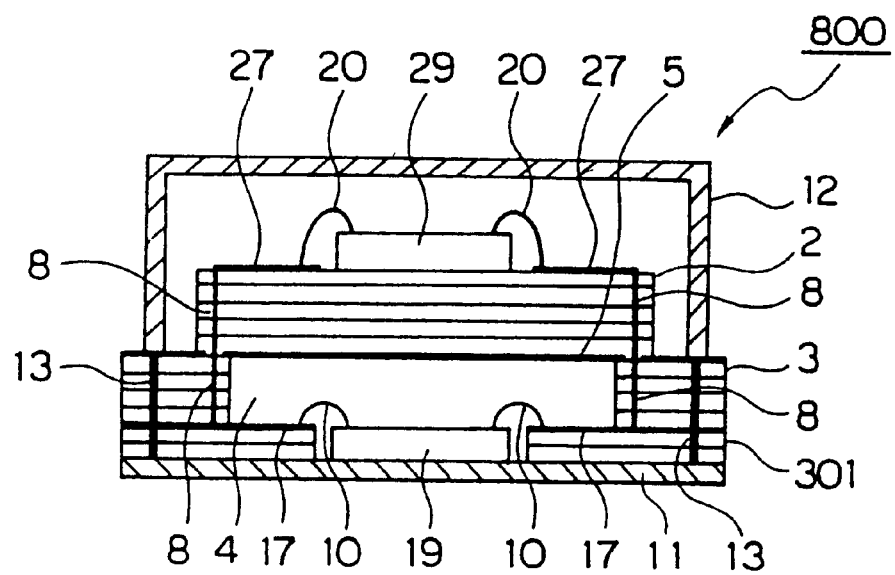
FIG. 9 is a sectional view showing the RF circuit module of the eighth embodiment of the present invention.

FIG. 9 is a sectional view showing an RF circuit module 800 of another embodiment of the present invention. In this figure, the configuration of the portion of the first dielectric circuit board 301 to which the RF semiconductor device 19 is mounted is different from that shown in FIG. 2.

One portion of the first dielectric circuit board 301 is removed from the bottom layer to the upper layer to expose the metal base 11 from the bottom surface of the cavity 4. The exposed metal base 11 within the cavity 4 has mounted thereon the first RF semiconductor device 19.

Thus, the RF circuit module 800 provides, in addition to the advantages of the RF circuit module shown in FIG. 2, the advantage that the heat from the RF semiconductor device 19 can be efficiently dissipated because the first RF semiconductor device 19 is mounted to the metal base 11 of a good thermal conductivity.

Embodiment 9

Figure 10:
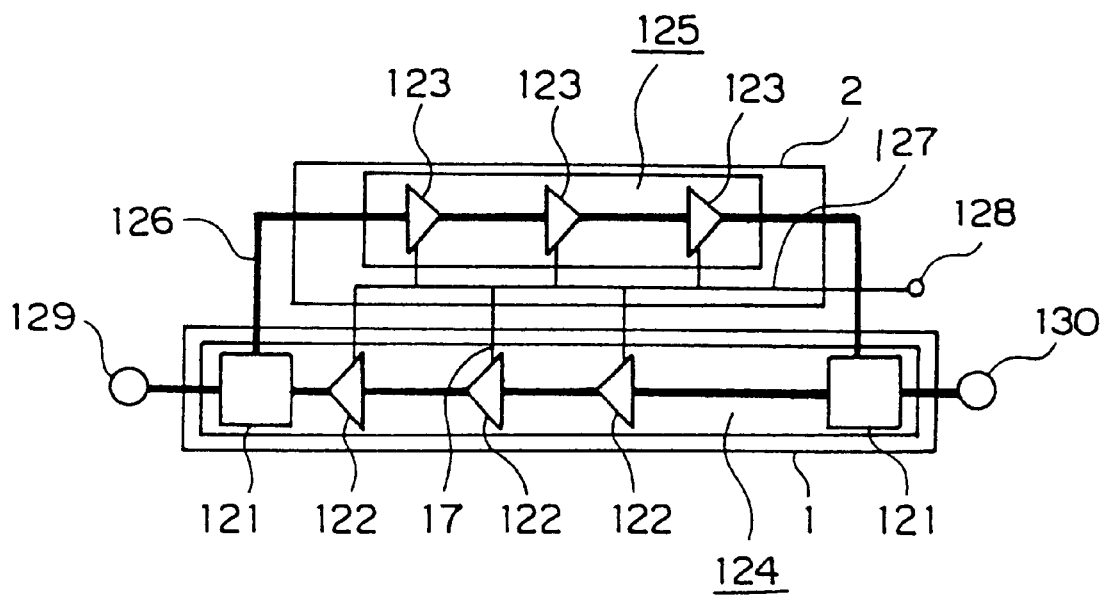
FIG. 10 is a circuit diagram showing the circuit of the RF circuit module of the ninth embodiment of the present invention.

FIG. 10 is a circuit diagram showing the circuit of the RF circuit module of another embodiment of the present invention. In this figure, the reference numeral 121 is a switch, 122 a high-power amplifier, 123 is a load noise amplifier, 124 is a transmitter circuit, 125 is a receiver circuit, 126 is an RF line, 127 is a DC line, 128 is a control circuit side terminal, 129 is an antenna side terminal and 130 is an input/output terminal.

The RF circuit module 100 shown in FIGS. 1 and 2 is used as an example for explaining the RF circuit module including this circuit. The high-power amplifier 122 and the transmitter circuit 124 including the switch 121 are mounted on the first dielectric circuit board 1. The receiver circuit 125 including the low noise amplifier 123 is mounted on the second dielectric circuit board 2. Furthermore, the DC line 17 for controlling the high-power amplifier 122 of the transmitter circuit 124 and the DC line 27 for controlling the low-noise amplifier 123 of the receiver circuit 125 are connected to each other and to the control circuit side terminal 128 through the second dielectric circuit board 2. The antenna side terminal 129 and the input/output terminal 130 are connected to each other through the first dielectric circuit board 1.

Thus, the RF circuit module of this embodiment allows for independent mounts of the transmitter circuit 124 and the receiver circuit. That is, the transmitter and receiver circuits 124 and 125 are separated from each other. As a result, the circuit arrangement of the RF circuit module can be made simple.

It will be apparent that many modifications and variations may be effected without departing from the scope of the present invention.

What is claimed is:

1. An RF circuit module comprising:
   a multi-layered first dielectric circuit board in which a cavity surrounded by a wall is formed in an upper layer;
   a first RF semiconductor device mounted within said cavity on said first dielectric circuit board;
   a second dielectric circuit board of at least one layer connected at an upper surface of said wall to said first dielectric circuit board and having a ground conductor disposed on its bottom surface;
   a second RF semiconductor device mounted to said upper surface of said second dielectric circuit board; and
   a metal cover covering said second dielectric circuit board and said second RF semiconductor device, connected at said upper surface of said wall to said first dielectric circuit board, and providing an electric shield for said second RF semiconductor device and a hermetic seal for said first and second RF semiconductor device.

2. An RF circuit module as claimed in claim 1, wherein said first dielectric circuit board comprises a dielectric member surrounding said second dielectric circuit board and wherein said metal cover has a plate-shape.

3. An RF circuit module comprising:
   a first dielectric circuit board having defined in a first surface a cavity surrounded by a wall;
   a first RF semiconductor device mounted within said cavity of said first dielectric circuit board;
   a second dielectric circuit board placed on said wall of said first dielectric circuit board;
   a second RF semiconductor device mounted to said second dielectric circuit board;
   a metal base placed on a second surface of said first dielectric circuit board;
   a number of embedded conductors embedded within said wall and arranged to surround said cavity and each having one end electrically connected to said metal base and said other end exposed from said first surface and arranged to surround said cavity; and
   a metal cover sealingly attached to said first dielectric circuit board to cover said second dielectric circuit board and said second RF semiconductor device, electrically connected at said upper surface of said wall, whereby said first and second RF semiconductor devices are electrically shielded and hermetically sealed.

4. An RF circuit module as claimed in claim 3, wherein said wall comprises an extension portion having defined therein a second cavity for surrounding said second dielectric circuit board and said second RF semiconductor device, and wherein said metal cover has a plate-like shape.

5. An RF circuit module as claimed in claim 3, wherein said first dielectric circuit board is a high-temperature burned circuit board and said second dielectric circuit board is a low-temperature burned circuit board.

6. An RF circuit module as claimed in claim 5, wherein said first dielectric circuit board has mounted thereon a transmission circuit and said second dielectric circuit board has mounted thereon a reception circuit.

7. An RF circuit module as claimed in claim 3, wherein said first dielectric circuit board and said second dielectric circuit board are electrically connected to each other through an anisotropic conductive sheet.

8. An RF circuit module as claimed in claim 3, further comprising a high-frequency circuit device, which is not necessary to be hermetically sealed, mounted on the first dielectric circuit board outside of the metal cover.

9. An RF circuit module as claimed in claim 8, wherein the first dielectric circuit board includes a stepped portion for mounting the high-frequency circuit device thereon.

10. An RF circuit module as claimed in claim 3, wherein the metal base on said first dielectric circuit board is exposed to said bottom of said cavity.

11. An RF circuit module as claimed in claim 3, wherein said dielectric circuit board and said second dielectric circuit board are electrically connected to each other through a solder bump.

* * * * *